United States Patent
Burns et al.

(10) Patent No.: US 11,610,780 B2
(45) Date of Patent: Mar. 21, 2023

(54) ALTERNATING HARDMASKS FOR TIGHT-PITCH LINE FORMATION

(71) Applicant: TESSERA LLC, San Jose, CA (US)

(72) Inventors: Sean D. Burns, Hopewell Junction, NY (US); Nelson M. Felix, Briarcliff Manor, NY (US); Chi-Chun Liu, Altamont, NY (US); Yann A. M. Mignot, Slingerlands, NY (US); Stuart A. Sieg, Albany, NY (US)

(73) Assignee: TESSERA LLC, San Jose, CA (US)

( * ) Notice: Subject to any disclaimer, the term of this patent is extended or adjusted under 35 U.S.C. 154(b) by 0 days.

(21) Appl. No.: 17/340,915

(22) Filed: Jun. 7, 2021

(65) Prior Publication Data

US 2021/0335619 A1   Oct. 28, 2021

Related U.S. Application Data

(63) Continuation of application No. 16/508,691, filed on Jul. 11, 2019, now Pat. No. 11,031,248, which is a continuation of application No. 15/802,634, filed on Nov. 3, 2017, now Pat. No. 10,410,875, which is a
(Continued)

(51) Int. Cl.
*H01L 21/308* (2006.01)
*H01L 29/66* (2006.01)
*H01L 21/3065* (2006.01)
*H01L 21/033* (2006.01)
*H01L 21/8234* (2006.01)

(52) U.S. Cl.
CPC ...... *H01L 21/3088* (2013.01); *H01L 21/0337* (2013.01); *H01L 21/3065* (2013.01); *H01L 21/3081* (2013.01); *H01L 21/3085* (2013.01); *H01L 21/3086* (2013.01); *H01L 21/823431* (2013.01); *H01L 29/66795* (2013.01)

(58) Field of Classification Search
None
See application file for complete search history.

(56) References Cited

U.S. PATENT DOCUMENTS

| | | |
|---|---|---|
| 5,821,169 A | 10/1998 | Nguyen et al. |
| 8,114,306 B2 | 2/2012 | Cheng et al. |
| 8,278,221 B2 | 10/2012 | Koh et al. |

(Continued)

OTHER PUBLICATIONS

Ting Han, "A Paradigm Shift in Patterning Foundation from Frequency Multiplication to Edge-Placement Accuracy—A Novel Processing Solution by Selective Etching and Alternating-Material Self-Aligned Multiple Patterning," Alternative Lithographic Technologies VIII, edited by Christopher Bencher, Joy Y. Cheng, Proc. of SPIE vol. 9777, 977718, Mar. 2016.

(Continued)

*Primary Examiner* — Allan W. Olsen
(74) *Attorney, Agent, or Firm* — Haley Guiliano LLP

(57) ABSTRACT

A method for forming fins includes forming a three-color hardmask fin pattern on a fin base layer. The three-color hardmask fin pattern includes hardmask fins of three mutually selectively etchable compositions. Some of the fins of the first color are etched away with a selective etch that does not remove fins of a second color or a third color and that leaves at least one fin of the first color behind. The fins of the second color are etched away. Fins are etched into the fin base layer by anisotropically etching around remaining fins of the first color and fins of the third color.

20 Claims, 10 Drawing Sheets

Related U.S. Application Data continuation of application No. 15/445,112, filed on Feb. 28, 2017, now Pat. No. 10,312,103.

(56) References Cited

U.S. PATENT DOCUMENTS

| | | |
|---|---|---|
| 8,859,433 B2 | 10/2014 | Abdallah et al. |
| 8,900,665 B2 | 12/2014 | Koshy |
| 9,099,401 B2 | 8/2015 | He et al. |
| 9,287,135 B1 | 3/2016 | Doris et al. |
| 9,337,033 B1 | 5/2016 | Glodde et al. |
| 9,349,604 B2 | 5/2016 | Rathsack et al. |
| 9,368,349 B2 | 6/2016 | Huang et al. |
| 9,391,141 B2 | 7/2016 | Chan et al. |
| 9,425,058 B2 | 8/2016 | Kim et al. |
| 9,431,265 B2 | 8/2016 | Cheng et al. |
| 9,536,750 B1 | 1/2017 | Chi et al. |
| 9,779,944 B1 | 10/2017 | Burns et al. |
| 9,991,132 B2 | 6/2018 | Tseng et al. |
| 10,103,022 B2 | 10/2018 | Arnold et al. |
| 2008/0008969 A1 | 1/2008 | Zhou et al. |
| 2010/0167214 A1 | 7/2010 | Yoon et al. |
| 2012/0313169 A1 | 12/2012 | Wahl et al. |
| 2014/0322915 A1 | 10/2014 | Lee et al. |
| 2016/0042964 A1 | 2/2016 | Lo et al. |
| 2016/0071930 A1 | 3/2016 | Bentley et al. |
| 2016/0211168 A1 | 7/2016 | Paak et al. |
| 2016/0254369 A1 | 9/2016 | Yi et al. |
| 2018/0096846 A1 | 4/2018 | Arnold et al. |
| 2019/0013246 A1 | 1/2019 | Wallace et al. |
| 2019/0221428 A1 | 7/2019 | Burns et al. |

OTHER PUBLICATIONS

Shengxiang Ji, "Directed self-assembly of block copolymers on chemical patterns: A platform for nanofabrication," Progress in Polymer Science 54-55, Oct. 2015.

Hongyi Liu, "Layout Decomposition and Synthesis for a Modular Technology to Solve the Edge-Placement Challenges by Combining Selective Etching, Direct Stitching, and Alternating-Material Self-Aligned Multiple Patterning Processes," Design-Process-Technology Co-optimization for Manufacturability X, edited by Luigi Capodieci and Jason P. Cain, Proc. of SPIE vol. 9781, Mar. 2016.

List of IBM Patents or Patent Applications Treated as Related dated Mar. 13, 2019, 2 pages.

List of IBM Patents or Patent Applications Treated as Related dated Jul. 11, 2019, 2 pages.

Office action for U.S. Appl. No. 16/508,691, dated Jun. 12, 2020, Burns, "Alternating Hardmasks for Tight-Pitch Line Formation", 12 pages.

ALTERNATING HARDMASKS FOR TIGHT-PITCH LINE FORMATION

CROSS-REFERENCE TO RELATED APPLICATION

This patent application is a continuation of and claims priority to U.S. patent application Ser. No. 16/508,691, filed Jul. 11, 2019, now U.S. Pat. No. 11,031,248, issued Jun. 8, 2021, which is a continuation of U.S. patent application Ser. No. 15/802,634, filed Nov. 3, 2017, now U.S. Pat. No. 10,410,875, issued Sep. 10, 2019, which is a continuation of U.S. patent application Ser. No. 15/445,112, filed Feb. 28, 2017, now U.S. Pat. No. 10,312,103, issued Jun. 4, 2019, which are fully incorporated herein by reference.

BACKGROUND

Technical Field

The present invention generally relates to semiconductor fabrication and, more particularly, to the formation of hardmasks in semiconductor fabrication processes.

Description of the Related Art

Fin field effect transistors (FinFETs) and other fin-based devices are frequently used in semiconductor structures to provide small-scale integrated circuit components. As these devices scale down in size, performance can be increased but fabrication becomes more difficult. In particular, errors in edge placement, critical dimension, and overlay approach the size of the structures being fabricated, making it difficult to accurately form such structures.

One particular challenge in forming fin structures is the selective removal of particular fins. For example, while a series of fins can be created using, e.g., sidewall image transfer techniques, significant errors in masking the fins may occur when operating near the limit of the lithographic process. Such errors may cause fins neighboring the removed fin to be damaged or removed entirely.

SUMMARY

A method of forming fins includes forming a three-color hardmask fin pattern on a fin base layer. The three-color hardmask fin pattern includes hardmask fins of three mutually selectively etchable compositions. Some of the fins of the first color are etched away with a selective etch that does not remove fins of a second color or a third color and that leaves at least one fin of the first color behind. The fins of the second color are etched away. Fins are etched into the fin base layer by anisotropically etching around remaining fins of the first color and fins of the third color.

A method of forming a three-color hardmask fin pattern includes depositing a second-color material around fins of a first color. Fins of the first color are etched away, leaving gaps. The etch further leaves at least one fin of the first color remaining. Fins of a third color are formed in the gaps.

A method of forming a three-color hardmask fin pattern includes forming fins of a first color on a fin base layer, by forming self-assembled fins on a seed layer, etching away every other self-assembled fin, leaving remaining self-assembled fins having differing heights, and etching down into a layer of first-color material around the remaining self-assembled fins to form fins of a first color. A second-color material is deposited around the fins of the first color. Fins of the first color are etched away, leaving gaps. Fins of a third color are formed in the gaps.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a hardmask fabrication process that may be used for fin formation in semiconductor fabrication. The present embodiment forms hardmask fins of three different compositions that have mutual etch selectivity, such that a spacing between fins of the same type is large enough that lithographic masking errors will not interfere when selectively removing fins. This provides a tri-color alternating hardmask, where the three different "colors" represent the three different fin hardmask composition. Thus the term "color" is defined herein to refer to one particular hardmask composition.

The present disclosure therefore refers to "first-color," "second-color," and "third-color" materials and fins. Each of these "colors" can be etched selectively to the other two, making it possible to remove a fin of one color without damaging nearby fins of a different color.

Figure 1:
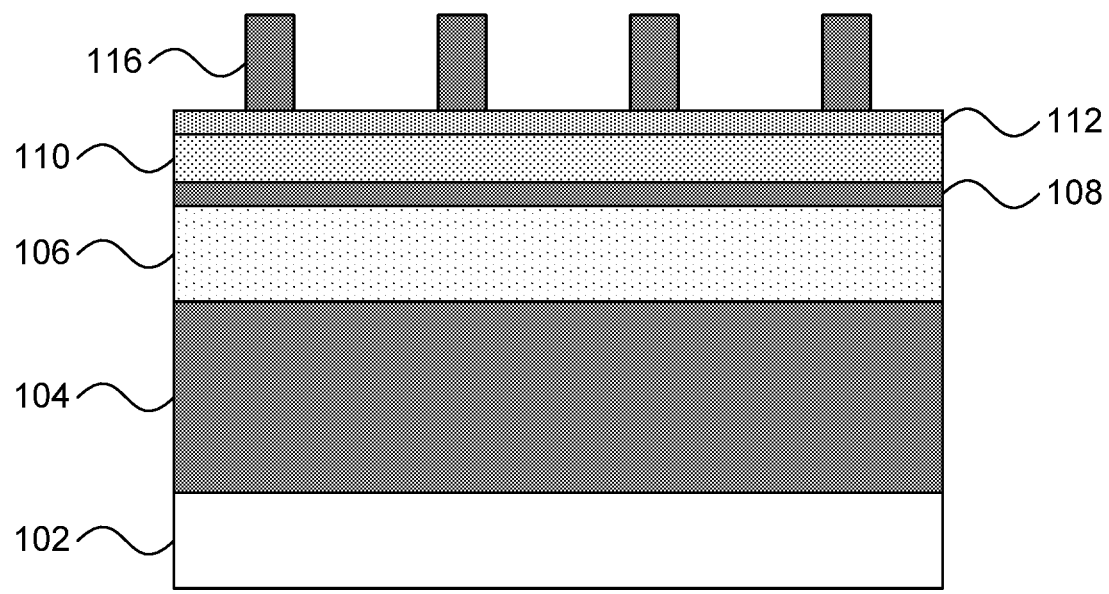
FIG. 1 is a cross-sectional diagram of a step in the formation of a tri-color hardmask in accordance with one embodiment of the present invention.

Referring now to FIG. 1, a cross-sectional diagram of a step in forming tri-color alternating hardmask is shown. A layer of fin base material 104 is formed on a semiconductor substrate 102. The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

The fin base material 104 may be any appropriate material that may be used as a hardmask for the eventual formation of semiconductor fins in the semiconductor substrate 102. In one embodiment, it is contemplated that the layer of fin base material 104 may have a thickness of about 40 nm. It is specifically contemplated that silicon nitride may be used for the fin base material 104, but it should be understood that any appropriate hardmask material having etch selectivity with the underlying semiconductor and the three tri-color hardmask materials may be used. As used herein, the term "selective" in reference to a material removal process denotes that the rate of material removal for a first material is greater than the rate of removal for at least another material of the structure to which the material removal process is being applied.

A layer of first-color hardmask material 106 is formed on the fin base material 104. It is specifically contemplated that the first-color hardmask material 106 may be formed from amorphous silicon, but any appropriate hardmask material having etch selectivity with the fin base material 104 and the other two tri-color hardmask materials may be used instead. In one embodiment the layer of first-color hardmask material 106 may have a thickness of about 20 nm.

A stack of layers is formed on top of the layer of first-color hardmask material 106. In particular, a first stack layer 108 is formed on the layer of first-color hardmask material 106 and may be formed from the same material as the fin base material 104 or any other appropriate material. In one embodiment the first stack layer 108 may have a thickness of about 5 nm. A second stack layer 110 is formed on the first stack layer 108. It is specifically contemplated that the second stack layer 110 may be formed from a dielectric material such as silicon dioxide and may have a thickness of about 10 nm.

A thin seed layer of polymer material 112 is formed on the stack. It is specifically contemplated that the seed layer 112 may be formed from, e.g., cross-linkable polystyrene, though it should be understood that other materials may be selected instead. The seed layer 112 is selected for its ability to guide later self-assembly of block copolymers (BCPs). In particular, seed material should match one of the two chains of the block copolymer system. For example, if a polystyrene/poly(methyl methacrylate) (PMMA) block copolymer is used, the seed layer 112 may be cross-linkable polystyrene. If a polystyrene/polyvinyl phenol (PVP) block copolymer is used, then the seed layer 112 may be cross-linkable PVP. In one particular embodiment, the seed layer 112 may be formed to a thickness between about 5 nm and about 8 nm, though it should be understood that greater or lesser thicknesses are also contemplated.

A set of fins 116 is formed on the seed layer 112. It is specifically contemplated that the fins 116 may be formed from a photoresist. The resist pattern of fins is formed at a pitch that is twice the natural period of the BCPs, which determines the ultimate fin pitch. For example, if fins having a pitch of 20 nm are ultimately needed, the fins 116 are formed at a pitch of 40 nm.

Figure 2:
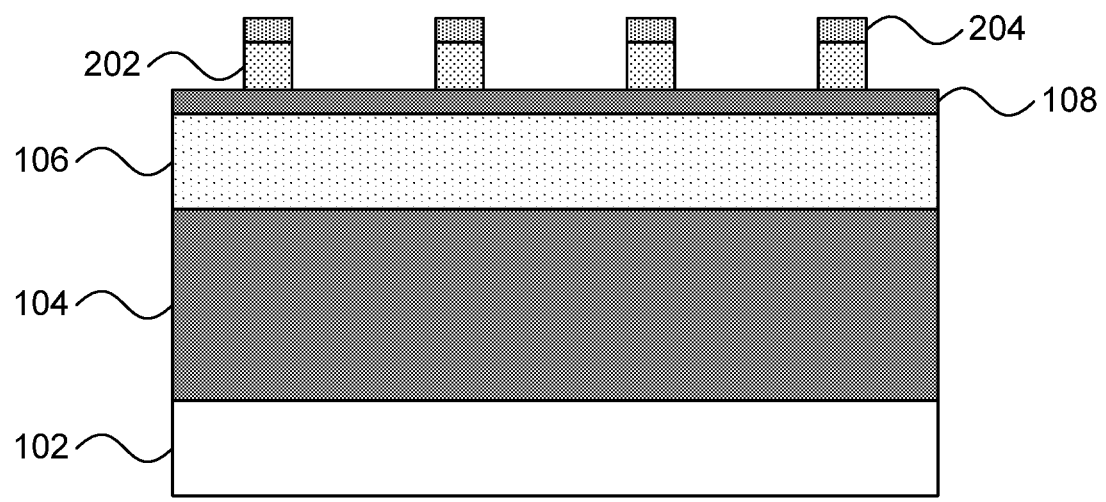
FIG. 2 is a cross-sectional diagram of a step in the formation of a tri-color hardmask in accordance with one embodiment of the present invention.

Referring now to FIG. 2, a cross-sectional diagram of a step in forming tri-color alternating hardmask is shown. The fins 116 are used as a mask to etch the seed layer 112 and the second stack layer 110. A directional etch, such as a reactive ion etch (RIE) may be used. Remaining mask material 116 after etch is then stripped by solvent to keep 204 intact. Portions of the seed layer 204 remain on fins of the second stack material 202.

RIE is a form of plasma etching in which, during etching, the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point include ion beam etching, plasma etching or laser ablation.

Figure 3:
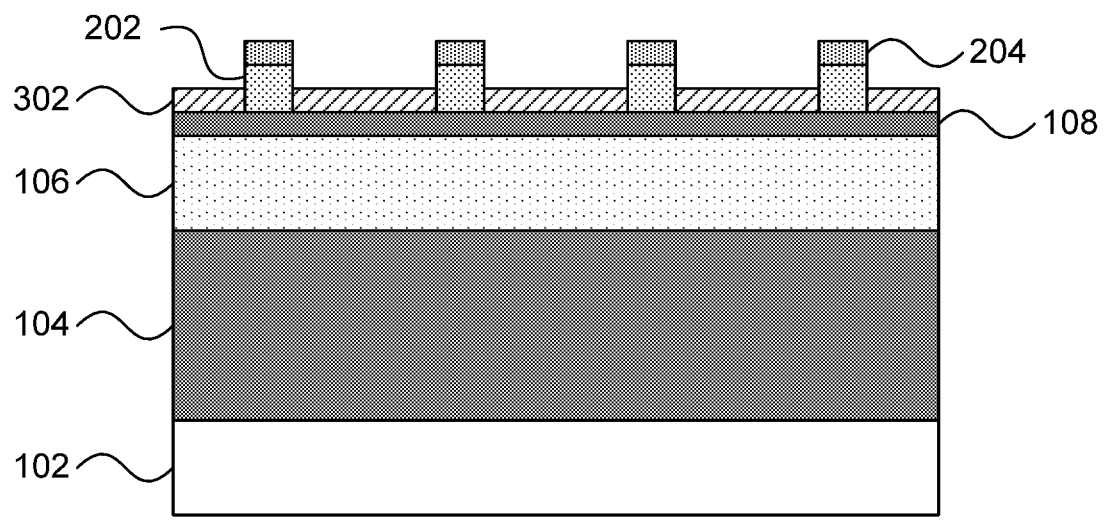
FIG. 3 is a cross-sectional diagram of a step in the formation of a tri-color hardmask in accordance with one embodiment of the present invention.

Referring now to FIG. 3, a cross-sectional diagram of a step in forming tri-color alternating hardmask is shown. A brush polymer layer 302 is applied over the first stack layer 108, the second stack material 202, and the seed layer 204. The brush polymer may be a linear polymer with a functional group at the chain end that bonds with the underlying substrates except material 204. Brush material 302 may be deposited using, e.g., spin coating. Limited by only one functional group per chain, a monolayer of brush is bonded to 108 and the sidewall of 202 while the excess brush can be rinsed away using solvents. The resulting thickness of the brush polymer layer 302 depends on the molecular size of the polymer, which is typically in the range of 2-10 nm. The pattern composed of 202, 204, and 302 is referred to as the guiding pattern for directed self-assembly. The brush polymer itself can be a random copolymer of the constituents of the block copolymer. For example, a polymer (styrene-random-MMA)-"end group" brush can be used for polystyrene-PMMA block copolymers.

Figure 4:
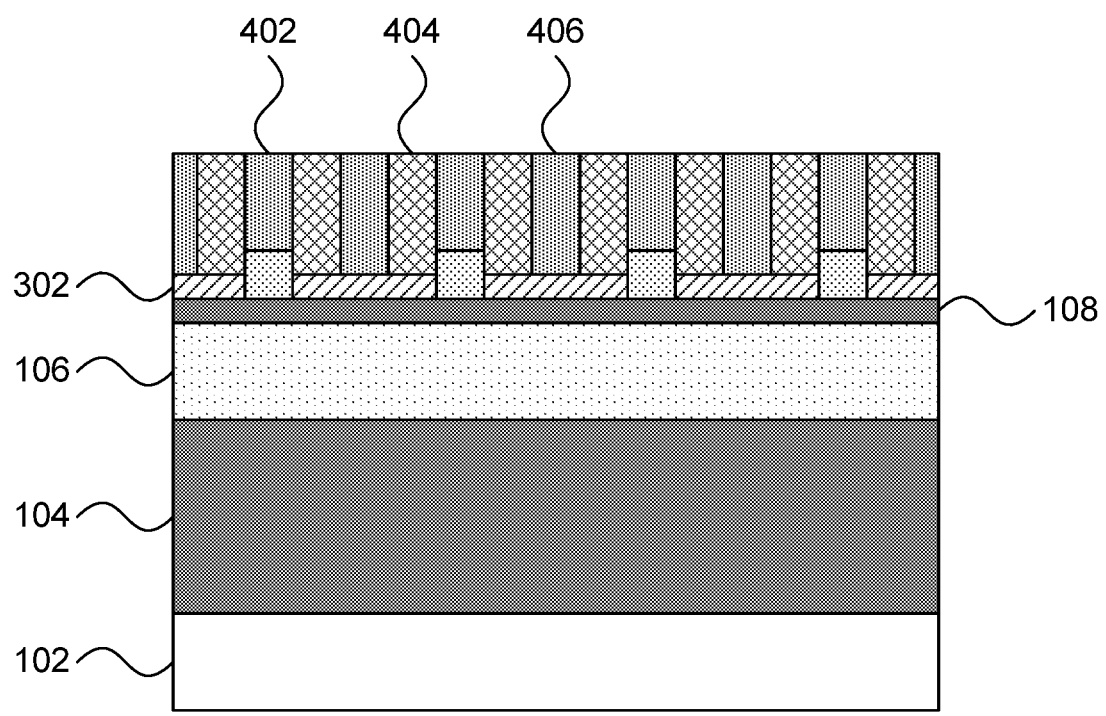
FIG. 4 is a cross-sectional diagram of a step in the formation of a tri-color hardmask in accordance with one embodiment of the present invention.

Referring now to FIG. 4, a cross-sectional diagram of a step in forming tri-color alternating hardmask is shown. A layer of block copolymers (BCP) is spin-coated over the guiding pattern and annealed between about 200 and about 280° C. for between about 5 and 100 minutes under nitrogen environment to promote the self-assembly process. This directed self-assembly (DSA) process of the BCPs will result in micro-domains 402, which will align to 204, 404 and 406. A BCP material used in this case is a linear polymer chain with two blocks of chemically distinct polymers covalently bonded together. In one specific example, the self-assembling BCP material may have one block that is polystyrene, e.g., forming fins 402 and 406, and one block that is poly(methyl methacrylate) (PMMA), e.g., forming fins 404.

The lengths of the polymer chains can be selected to produce micro-domains with pitch between about 10 nm and about 200 nm. In this case, it is specifically contemplated that the self-assembling material may have halves of equal length of about 5 nm each, forming a chain with a total length of about 10 nm. When the chains self-assemble, with like ends facing one another, the resulting fins of each material are about, e.g., 10 nm in width. The resulting alternating fin configuration has fin pitch of half the original fin pitch on the guiding pattern. For example, if the original resist pattern 116 were formed with a fin pitch of about 40 nm, the fins of first DSA material and second DSA material have a respective fin pitch of about 20 nm.

Figure 5:
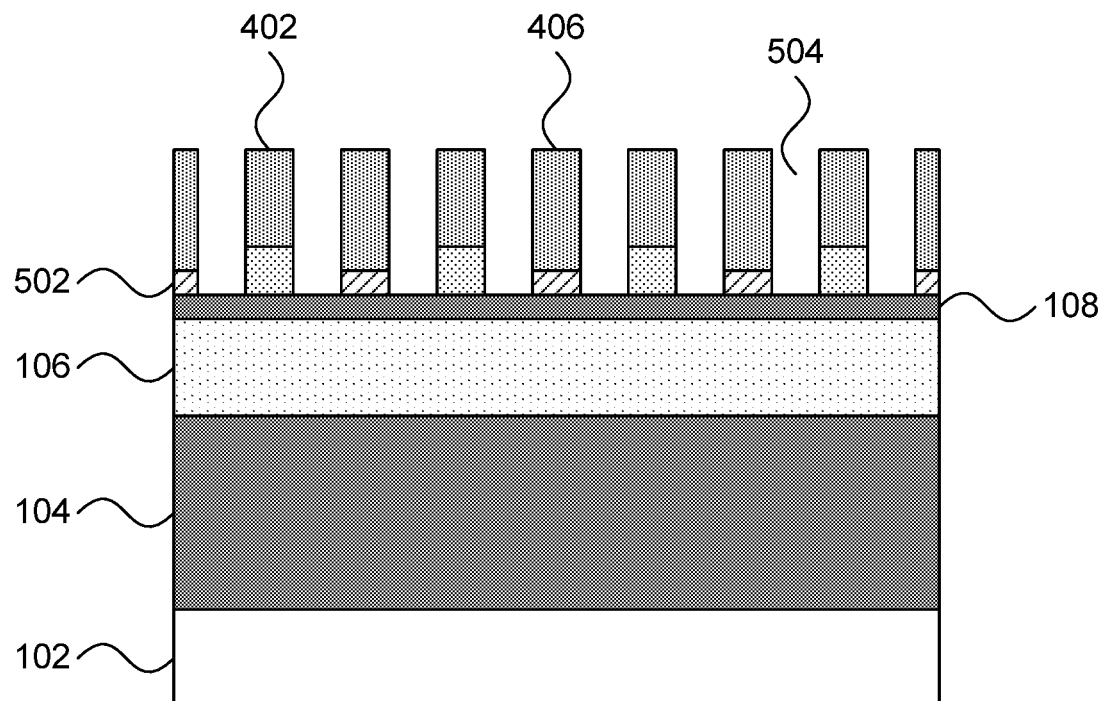
FIG. 5 is a cross-sectional diagram of a step in the formation of a tri-color hardmask in accordance with one embodiment of the present invention.

Referring now to FIG. 5, a cross-sectional diagram of a step in forming tri-color alternating hardmask is shown. The fins of second BCP block 404 are removed by selective etching, leaving gaps 504 between the fins of first DSA material 402/406. The etch selectively removes the second DSA material 404 with only partial consumption of the first DSA material 402/406 and also etches down into the brushed-on polymer layer 302. Depending on the etch process chosen, selectivity between 404 and 402/406 is about or greater than 2.

Figure 6:
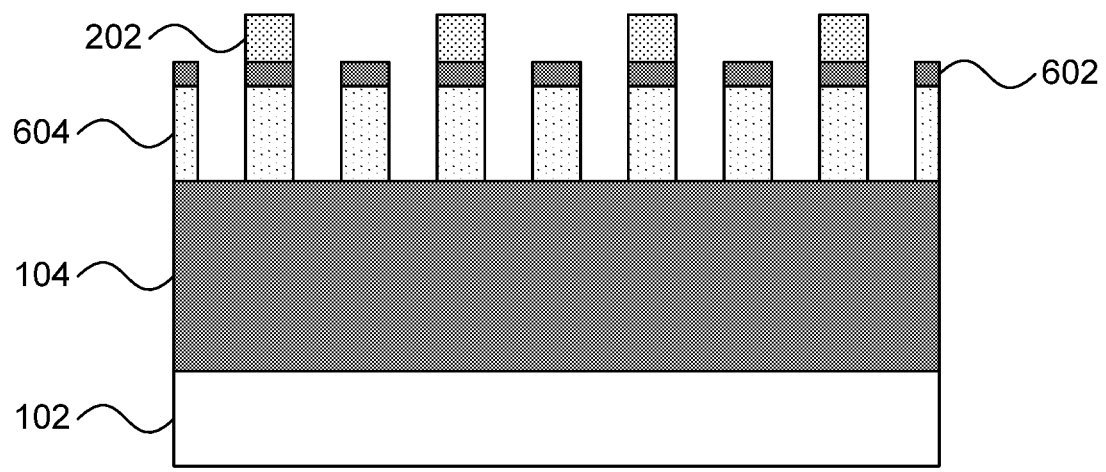
FIG. 6 is a cross-sectional diagram of a step in the formation of a tri-color hardmask in accordance with one embodiment of the present invention.

Referring now to FIG. 6, a cross-sectional diagram of a step in forming tri-color alternating hardmask is shown. Using the fins of first DSA material 402/406 as a mask, the layer of first-color hardmask material 106 is etched down. A first breakthrough etch, such as RIE, anisotropically etches the material of the first stack layer 108. Because 402/406 domains have a material-controlled, uniform dimension, any irregularities in the caps of second stack material 202 can be trimmed and rectified during the breakthrough etch. A second anisotropic etch, such as RIE, removes material from the layer of first-color hardmask material 106, forming fins 604 with caps of the first stack material 602. Caps of the second stack material 202 remain on alternating fins, providing fins of alternating heights.

Figure 7:
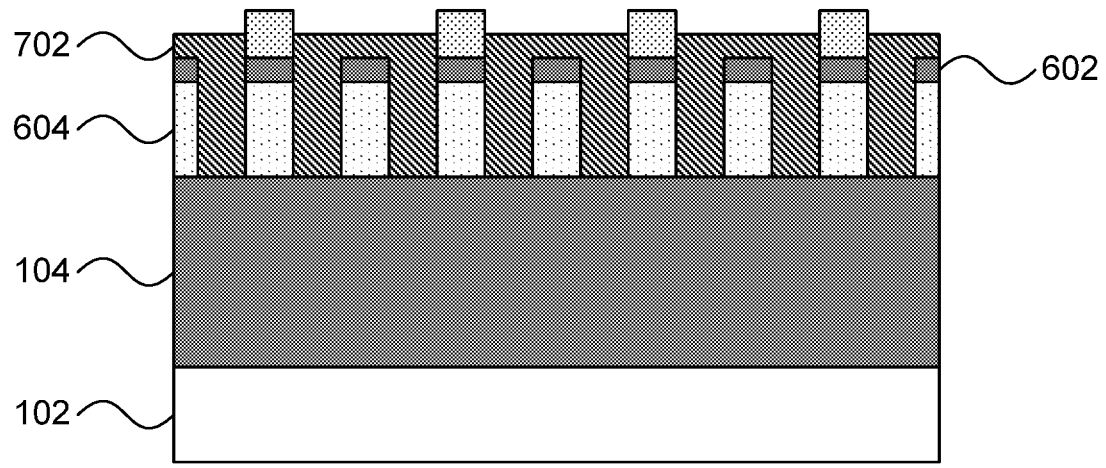
FIG. 7 is a cross-sectional diagram of a step in the formation of a tri-color hardmask in accordance with one embodiment of the present invention.

Referring now to FIG. 7, a cross-sectional diagram of a step in forming tri-color alternating hardmask is shown. An organic planarizing layer (OPL) 702 is deposited onto the surface and recessed down below the height of the caps of second stack material 202 but above the height of the caps of first stack material 602. In one embodiment, the OPL 702 may be formed from, e.g., spin-on carbon that forms an amorphous-like carbon structure, but any appropriate planarization material may be used instead. The OPL 702 is formed as a second-color hardmask material that has etch selectivity with the fin base material 104, the fins of first-color hardmask material 604, and a third-color hardmask material.

Figure 8:
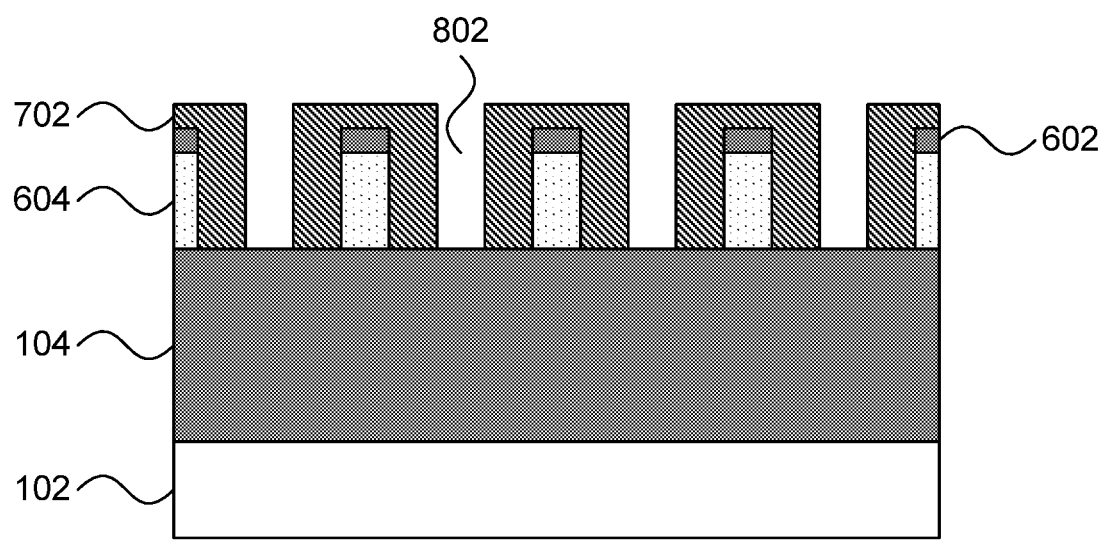
FIG. 8 is a cross-sectional diagram of a step in the formation of a tri-color hardmask in accordance with one embodiment of the present invention.

Referring now to FIG. 8, a cross-sectional diagram of a step in forming tri-color alternating hardmask is shown. The caps of second stack material 202 are removed selectively using, e.g., a buffered oxide etch, and the exposed caps of the second stack material 602 are removed by a selective etch that leaves the OPL 702 undamaged. Exposed fins 604 are then removed by a selective etch, leaving behind those fins 604 that are protected by the OPL 702. Gaps 802 remain between regions of the OPL 702.

Figure 9:
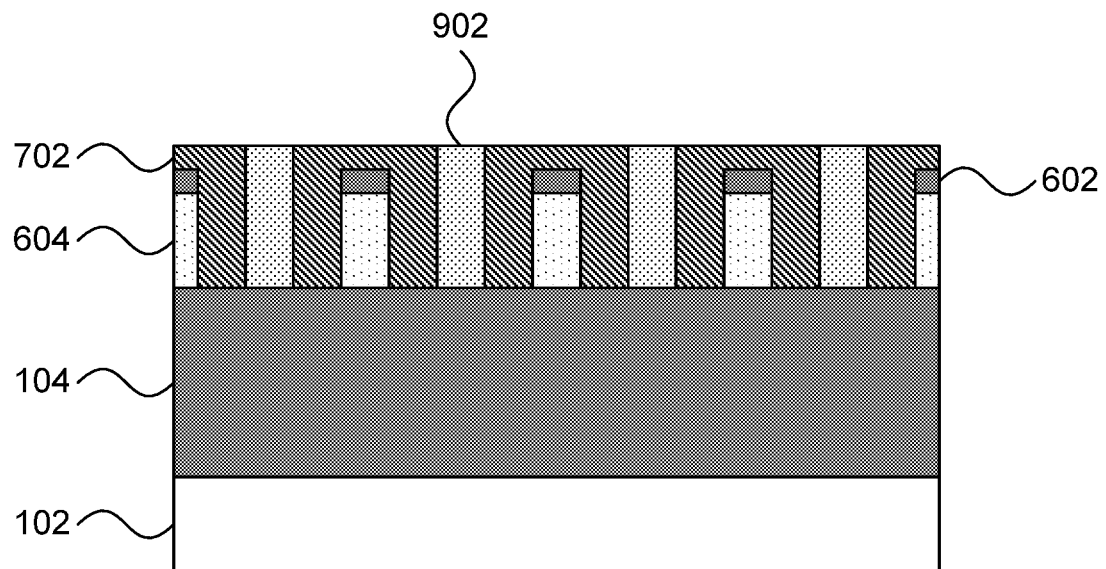
FIG. 9 is a cross-sectional diagram of a step in the formation of a tri-color hardmask in accordance with one embodiment of the present invention.

Referring now to FIG. 9, a cross-sectional diagram of a step in forming tri-color alternating hardmask is shown. The gaps 802 are filled with a third-color hardmask material to form fins 902. The third-color hardmask material may be, for example, silicon dioxide and may be deposited using, e.g., atomic layer deposition (ALD), spin-on deposition, or flowable deposition. Alternatively, the third-color hardmask material may be any appropriate material that has etch selectivity with the fins (the first-color hardmask material) 604, the OPL (the second-color hardmask material) 702, and the base fin material 104.

Figure 10:
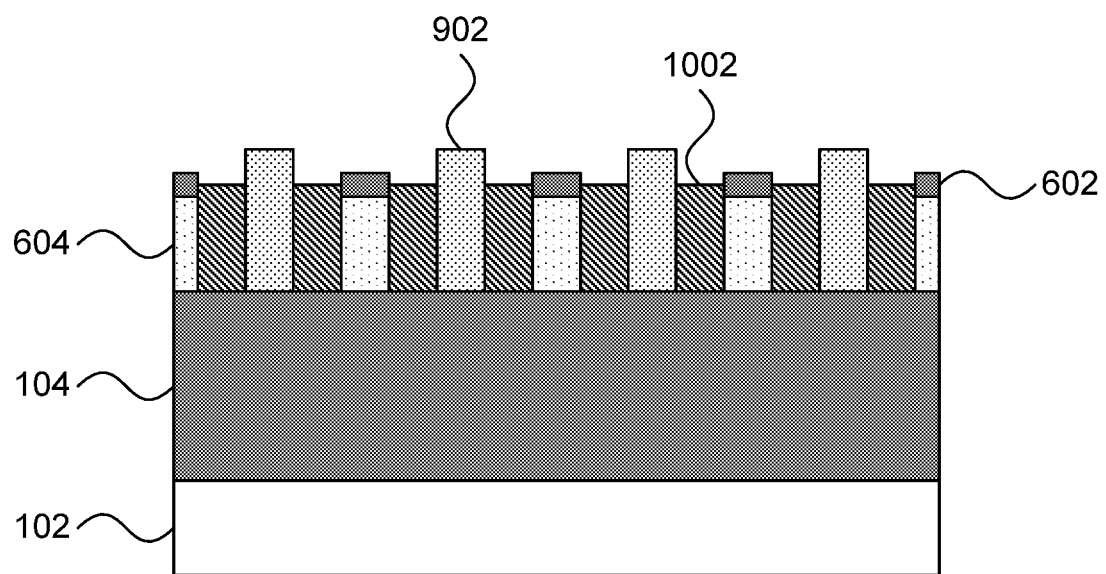
FIG. 10 is a cross-sectional diagram of a step in the formation of a tri-color hardmask in accordance with one embodiment of the present invention.

Referring now to FIG. 10, a cross-sectional diagram of a step in forming tri-color alternating hardmask is shown. The OPL 702 is recessed below the height of the fin caps of first stack material 602 by chemical mechanical planarization (CMP) or by ME, separating the OPL 702 into fins of second-color hardmask material 1002. The result is a series of fins which can be selectively etched with respect to their neighbors. In particular, the fins of first-color hardmask material 604 and the fins of third-color hardmask material 902 have a pitch to their closest neighbor of the same material that is the same as the pitch of the original fins 116 (e.g., 40 nm). Thus, a mask can be reliably formed for the removal of one fin without affecting its direct neighbors.

Figure 11:
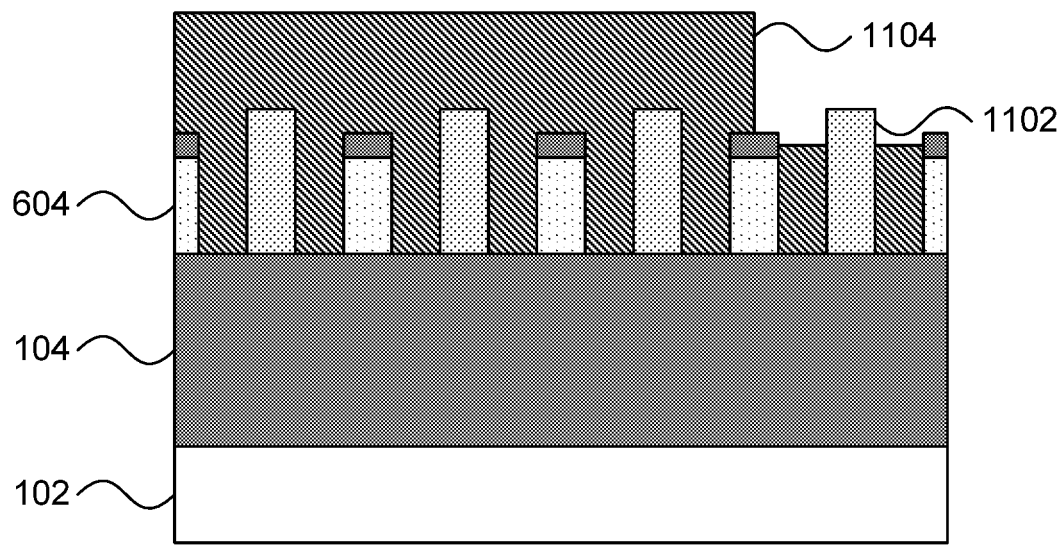
FIG. 11 is a cross-sectional diagram of a step in the selective etch of fins using a tri-color hardmask in accordance with one embodiment of the present invention.

Referring now to FIG. 11, a cross-sectional diagram of a step in selectively removing a fin is shown. An mask 1104 is formed, leaving exposed at least one fin 1102. It should be noted that the mask 1104 may expose neighboring fins as well, as long as those fins are not formed from the same material as the selected fin 1102. The mask 1104 may be formed by, e.g., chemical vapor deposition, physical vapor deposition, ALD, spin-on deposition, gas cluster ion beam (GOB) deposition, or any other appropriate deposition process.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GOB deposition, a high-pressure gas is allowed to expand in a vacuum, subsequently condensing into clusters. The clusters can be ionized and directed onto a surface, providing a highly anisotropic deposition.

Figure 12:
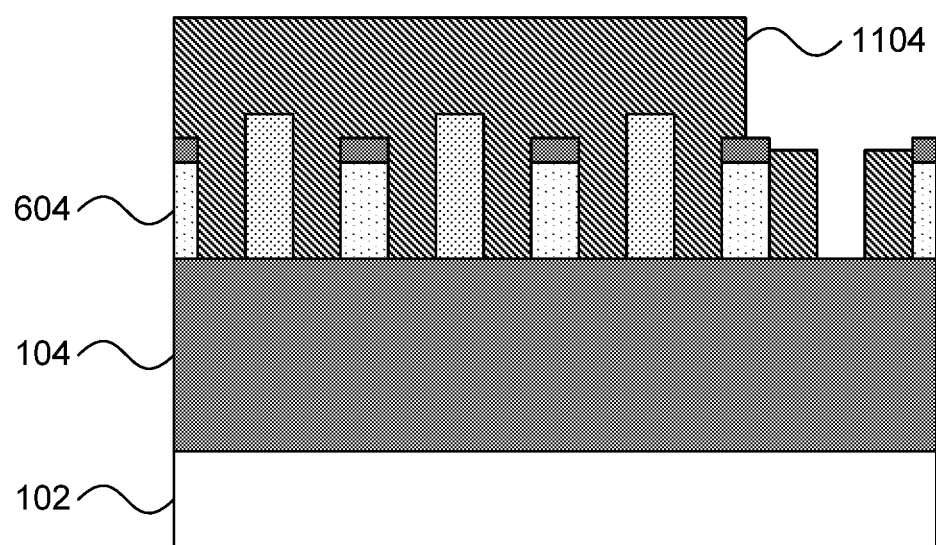
FIG. 12 is a cross-sectional diagram of a step in the selective etch of fins using a tri-color hardmask in accordance with one embodiment of the present invention.

Referring now to FIG. 12, a cross-sectional diagram of a step in selectively removing a fin is shown. The fin 1102 is etched away using any appropriate isotropic or anisotropic etch. Because the neighboring fin have etch selectivity with the selected fin 1102, they are not affected by the removal of the selected fin 1102.

Figure 13:
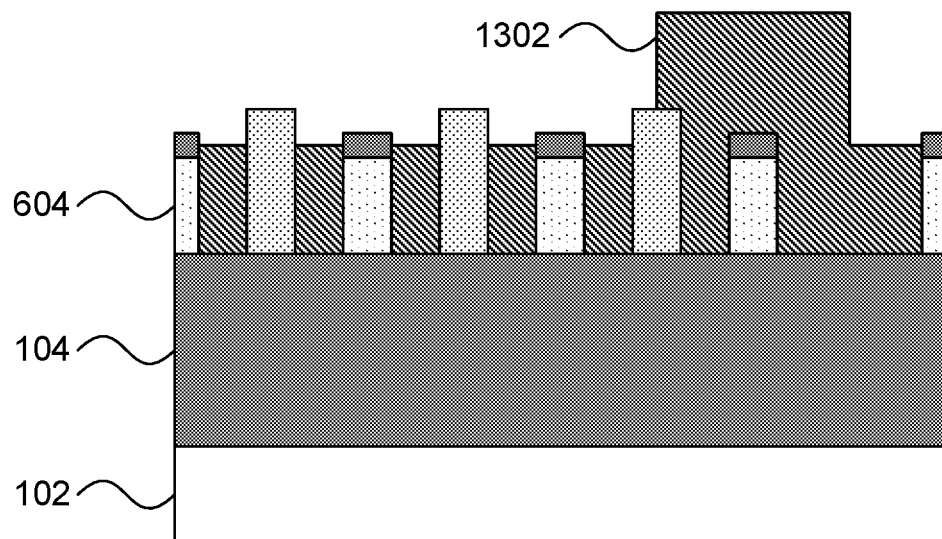
FIG. 13 is a cross-sectional diagram of a step in the selective etch of fins using a tri-color hardmask in accordance with one embodiment of the present invention.

Referring now to FIG. 13, a cross-sectional diagram of a step in selectively preserving a fin is shown. In this example, a mask 1302 is formed over a fin of a particular color to be preserved. The other fins of the first-color hardmask material 604 remain uncovered.

Figure 14:
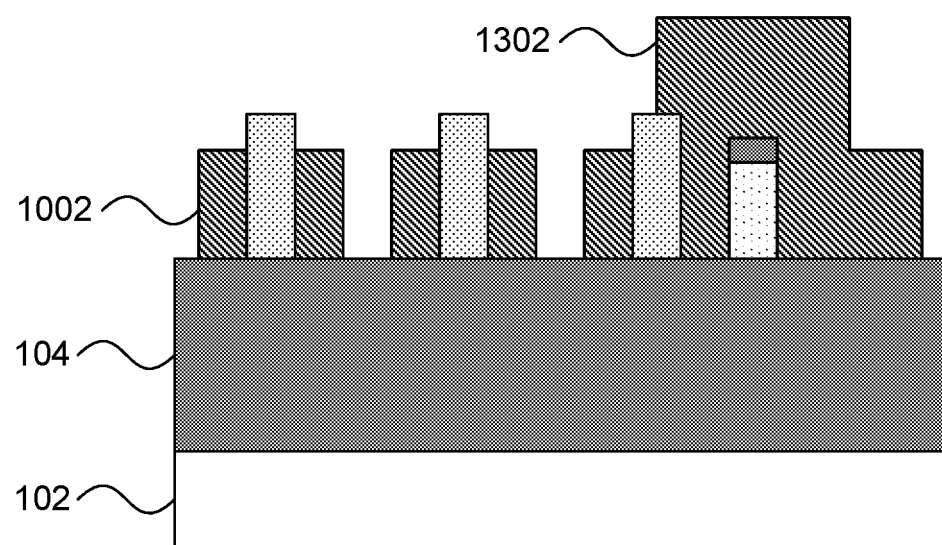
FIG. 14 is a cross-sectional diagram of a step in the selective etch of fins using a tri-color hardmask in accordance with one embodiment of the present invention.

Referring now to FIG. 14, a cross-sectional diagram of a step in selectively preserving a fin is shown. Those fins 604 that are not covered by the mask 1302 are etched away using any appropriate etch. Because the pitch between the fins 604 is large, there is little risk of the mask 1302 covering an unintended fin and preventing such a fin from being removed.

Figure 15:
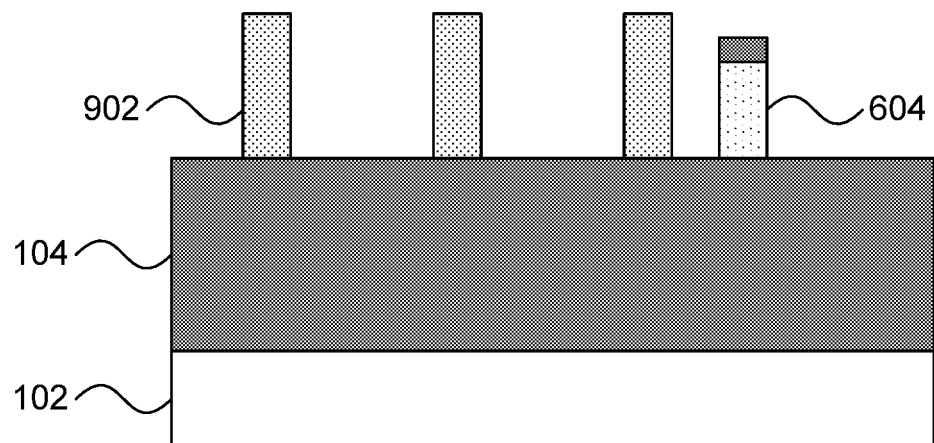
FIG. 15 is a cross-sectional diagram of a step in the selective etch of fins using a tri-color hardmask in accordance with one embodiment of the present invention.

Referring now to FIG. 15, a cross-sectional diagram of a step in forming semiconductor fins is shown. The remaining mask 1302 and the fins of the second-color hardmask material 1002 are removed by any appropriate isotropic or anisotropic etch process. The selected fins of first-color hardmask material 604 and fins of third-color hardmask material 902 remain on the fin base material 104.

Figure 16:
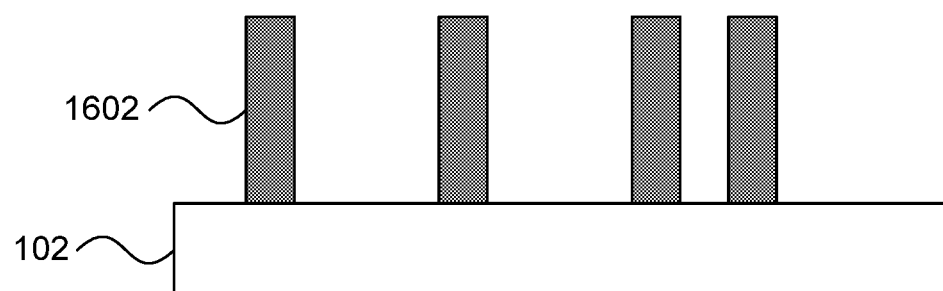
FIG. 16 is a cross-sectional diagram of a step in the selective etch of fins using a tri-color hardmask in accordance with one embodiment of the present invention.

Referring now to FIG. 16, a cross-sectional diagram of a step in forming semiconductor fins is shown. The remaining first-color fins 604 and third-color fins 902 are used as masks to etch the fin base material 104, producing a set of hardmask fins 1602. An appropriate directional etch such as RIE may be used, stopping on the underlying semiconductor substrate 102. The fins 1602 may be used directly in subsequent processing steps or may, alternatively, be used to form further fins in the semiconductor substrate 102 for, e.g., fin field effect transistors (FinFETs).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context dearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation n addition to the orientation depicted in the FIGS. For example, if the device in the FIGS. is turned over, elements described as "below" or "beneath" other elements or features could then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two lave one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 17:
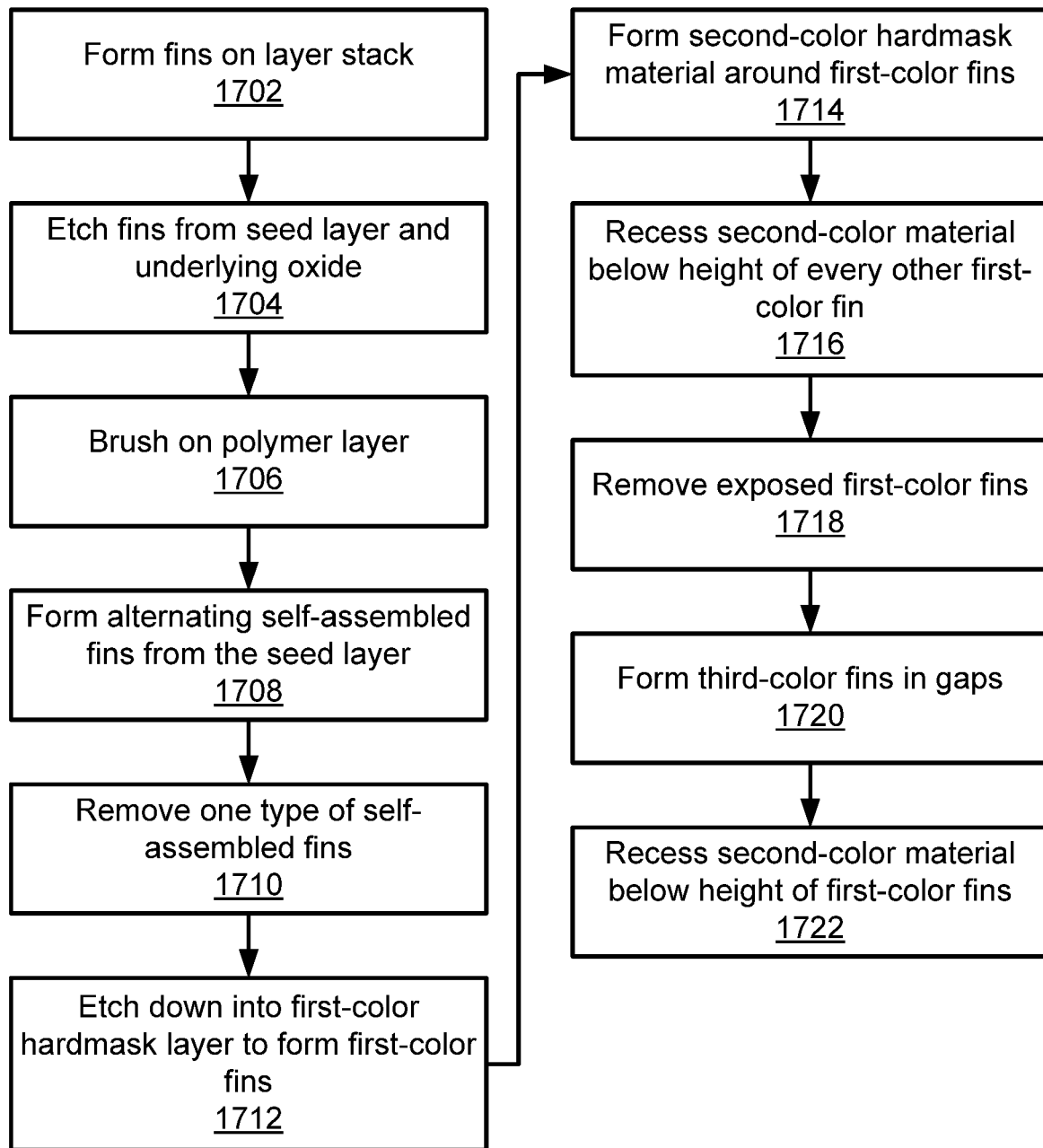
FIG. 17 is a block/flow diagram of a method of a forming tri-color hardmask in accordance with one embodiment of the present invention.

Referring now to FIG. 17, a method of forming three-color hardmask fins is shown. Block 1702 forms photoresist fins 116 on a stack of layers. The stack of layers is described in detail above with respect to FIG. 1. Block 1704 etches photoresist fins into, e.g., a seed layer 112 and an oxide layer 110, creating islands 202 with seed layers 204 on top of them. Block 1706 forms a monolayer of polymer brush material 302 on the stack between the islands 202.

Block 1708 forms alternating, self-assembled fins 402, 404, and 406 from the guiding pattern, using molecular chains that have one block that is attracted by the seed layer 204 and one block that sits on brush material 302. Block 1710 then removes one type of the fins (particularly fins 404) using a selective etch process. Block 1712 etches down into a first-color hardmask material 106 to form first-color fins 604.

Block 1714 forms second-color hardmask material (e.g., OPL 702) in the gaps between the first-color fins 604. Block 1716 then recesses the second-color hardmask material down below the height of every other first-color fin, such that the second-color hardmask material has a height below the height of half of the first-color fins 604 and above the height of the other half of the first color fins 604.

Block 1718 removes the exposed first-color fins using any appropriate etch to form gaps 802. Block 1720 forms third-color hardmask material in the gaps 802. This material may be deposited by any appropriate deposition process and then polished down using, e.g., chemical mechanical planarization. CMP is performed using, e.g., a chemical or granular slurry and mechanical force to gradually remove upper layers of the device. The slurry may be formulated to be unable to dissolve, for example, the work function metal layer material, resulting in the CMP process's inability to proceed any farther than that layer.

Block 1722 recesses the second-color material below the height of all the first-color fins 604. The result is three sets of fins: first-color fins 604, second-color fins 1002, and third-color fins 902. Each color of fins has etch selectivity with each of the others, such that positioning or size errors in a mask that covers or uncovers a particular fin are unlikely to affect neighboring fins of the same color.

Figure 18:
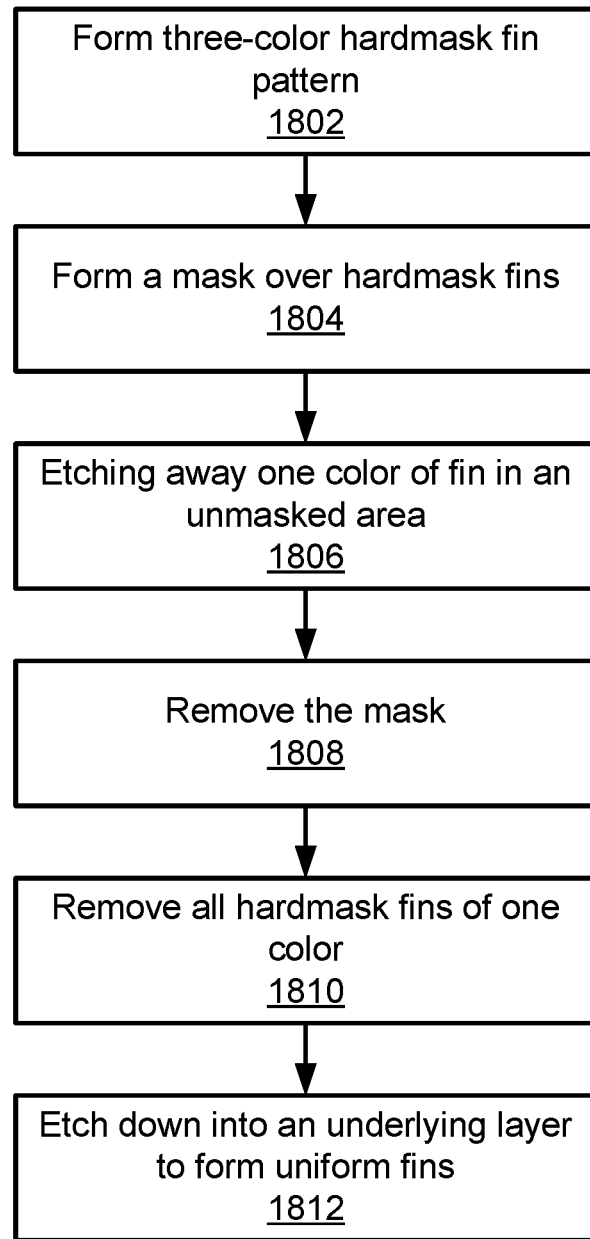
FIG. 18 is a block/flow diagram of a method of etching fins using a tri-color hardmask in accordance with one embodiment of the present invention.

Referring now to FIG. 18, a method of fin formation is shown. Block 1802 forms a three-color hardmask fin pattern, for example in the manner described above with respect to FIG. 17. The hardmask materials of the fins are formed in the sequence of Color ABCBABCBA . . . . Block 1804 forms a mask over the three-color hardmask fins, leaving one or more fins exposed. Block 1806 etches away one color of fin in the exposed area, leaving any other color of fin that may be exposed unharmed. Block 1808 removes the mask. One can repeat 1804 to 1808 multiple times to select different colors of fins to customize before moving onto block 1810, which removes all hardmask fins of one of the three colors. In the examples above, this refers to the second-color fins 604. Block 1812 then etches down into an underlying layer (e.g., fin base material 104) to form fins of a uniform material, but with variable spacing.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of manufacturing a semiconductor integrated circuit comprising:
   providing a plurality of hardmask fins above a substrate, wherein:
   the plurality of hardmask fins comprises first hardmask fins and second hardmask fins, each of the first and second hardmask fins comprising a first-color material;
   the plurality of hardmask fins alternate between a hardmask fin of the first hardmask fins and a hardmask fin of the second hardmask fins; and
   each of the first hardmask fins has a greater height than each of the second hardmask fins;
   forming a layer of a second-color material between the alternating first and second hardmask fins and over the second hardmask fins, such that an upper surface of each of the first hardmask fins is exposed and an upper surface of each of the second hardmask fins is covered;
   removing the first hardmask fins to provide gaps between regions of the second-color material layer; and
   forming third hardmask fins comprising a third-color material in the gaps.

2. The method of claim 1, further comprising:
   etching, using a mask, to selectively remove one or more second hardmask fins.

3. The method of claim 2, further comprising:
   removing the second-color material layer; and
   transferring a resultant pattern of second and third hardmask fins to an underlying layer.

4. The method of claim 2, wherein using the mask comprises using a mask having an opening that exposes at least one upper surface of a third hardmask fin.

5. The method of claim 4, wherein using the mask further comprises having an opening that exposes at least two upper surfaces of third hardmask fins.

6. The method of claim 1, further comprising:
   etching, using a mask, to selectively remove one or more third hardmask fins.

7. The method of claim 6, further comprising:
   removing the second-color material layer; and
   transferring a resultant pattern of second and third hardmask fins to an underlying layer.

8. The method of claim 6, wherein using the mask further comprises using a mask having an opening that exposes at least one upper surface of a second hardmask fin.

9. The method of claim 8, wherein using the mask further comprises having an opening that exposes at least two upper surfaces of second hardmask fins.

10. The method of claim 1, further comprising:
    etching, using a first mask, to selectively remove one or more second hardmask fins; and etching, using a second mask, to selectively remove one or more third hardmask fins.

11. The method of claim 10, further comprising:
removing the second-color material layer; and
transferring a resultant pattern of second and third hardmask fins to an underlying layer.

12. The method of claim 1, wherein a pitch between adjacent second hardmask fins is substantially the same as a pitch between adjacent third hardmask fins.

13. The method of claim 1, wherein a pitch between adjacent second and third hardmask fins is approximately one-half a pitch between adjacent second hardmask fins.

14. The method of claim 1, wherein a pitch between adjacent second and third hardmask fins is approximately 20 nm.

15. The method of claim 1, wherein the second-color material layer comprises carbon.

16. The method of claim 1, wherein upper surfaces of the first hardmask fins comprise a first capping material, upper surfaces of the second hardmask fins comprise a second capping material, and wherein the first and second capping materials are different.

17. The method of claim 1, wherein the first and second hardmask fins each comprise a lower portion having an upper surface comprising the first-color material and an upper portion comprising one or more capping materials, and wherein the upper portion of each of the first hardmask fins has a greater height than the upper portion of each of the second hardmask fins.

18. The method of claim 17, wherein the lower portions of each of the first and second hardmask fins have approximately the same height.

19. The method of claim 17, wherein the upper portions of the first hardmask fins comprise at least a first capping material and a second capping material, and wherein the upper portions of the second hardmask fins comprise the first capping material but not the second capping material.

20. The method of claim 1, wherein the second-color material layer comprises a spin-on material.

* * * * *